(12) United States Patent
Choi et al.

(10) Patent No.: US 8,723,024 B2
(45) Date of Patent: *May 13, 2014

(54) TRANSPARENT ELECTRODE COMPRISING GRAPHENE SHEET, AND DISPLAY AND SOLAR CELL INCLUDING THE ELECTRODE

(75) Inventors: Jae-Young Choi, Yongin-si (KR); Hyeon-Jin Shin, Yongin-si (KR); Seon-mi Yoon, Yongin-si (KR); Young-hee Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 444 days.

This patent is subject to a terminal disclaimer.

(21) Appl. No.: 12/105,738

(22) Filed: Apr. 18, 2008

(65) Prior Publication Data
US 2009/0071533 A1    Mar. 19, 2009

(30) Foreign Application Priority Data
Sep. 13, 2007   (KR) .......................... 10-2007-0093253

(51) Int. Cl.
*H01L 31/00*  (2006.01)
*G11B 11/105*  (2006.01)

(52) U.S. Cl.
USPC ............................ 136/263; 136/252; 428/332

(58) Field of Classification Search
USPC ............. 136/243, 263, 252; 257/40; 428/209, 428/332
See application file for complete search history.

(56) References Cited

U.S. PATENT DOCUMENTS

| | | | |
|---|---|---|---|
| 2004/0221888 A1* | 11/2004 | Fukui et al. | 136/263 |
| 2004/0265550 A1* | 12/2004 | Glatkowski et al. | 428/209 |
| 2006/0131566 A1* | 6/2006 | Liu et al. | 257/40 |
| 2007/0284557 A1* | 12/2007 | Gruner et al. | 252/500 |

OTHER PUBLICATIONS

Wang et al. "Transparent, conductive graphene electrodes for dye-sensitized solar cells". Nano Letters 2008. vol. 8, No. 1, 323-327. Published on Web Dec. 11, 2007.*

* cited by examiner

*Primary Examiner* — Jonathan Johnson
*Assistant Examiner* — Lindsey Bernier
(74) *Attorney, Agent, or Firm* — Cantor Colburn LLP

(57) ABSTRACT

Provided is a transparent electrode including a graphene sheet. A transparent electrode having high conductivity, low sheet resistance, and low surface roughness can be prepared by employing the graphene sheet.

19 Claims, 4 Drawing Sheets

TRANSPARENT ELECTRODE COMPRISING GRAPHENE SHEET, AND DISPLAY AND SOLAR CELL INCLUDING THE ELECTRODE

CROSS-REFERENCE TO RELATED PATENT APPLICATION

This application claims the benefit of Korean Patent Application No. 10-2007-0093253, filed on Sep. 13, 2007, in the Korean Intellectual Property Office, the disclosure of which is incorporated herein in its entirety by reference.

BACKGROUND OF THE INVENTION

1. Field of the Invention

The present invention relates to a transparent electrode including a graphene sheet, and a display and a solar cell respectively including the electrode, and more particularly, to a transparent electrode having improved electrical and physical characteristics by employing a large-area graphene sheet having a desired thickness, and a display and a solar cell respectively including the transparent electrode.

2. Description of the Related Art

In general, display devices and solar cells which transmit light to form images or generate electric power include transparent electrodes as an essential element. Indium tin oxide (ITO) is widely used for a transparent electrode. However, with increased utilization and cost of ITO, the use of ITO is becoming uneconomical. Also, when a transparent electrode formed of ITO is bent, cracks occur therein, and thus the electrode's resistance increases.

Accordingly, the use of ITO electrodes may cause quality deterioration in flexible devices, and thus there is a need to develop a novel transparent electrode that can be used in flexible devices, for example, a transparent electrode including a carbon nanotube. A transparent electrode including a carbon nanotube can be used in a wide variety of devices, such as liquid crystal devices (LCDs), organic light emitting display devices (OLEDs), electronic paper like displays, or solar cells. However, carbon nanotubes have a very low yield when are purified after synthesis. Carbon nanotubes exhibit different metallic and semiconducting characteristics according to their chirality and diameter. Furthermore, since carbon nanotubes having identical semiconducting characteristics have different energy band gaps, carbon nanotubes are required to be separated from each other in order to obtain desired semiconducting or metallic characteristics. However, separating single wall carbon nanotubes is not a simple process.

SUMMARY OF THE INVENTION

The present invention provides a transparent electrode having improved electrical and physical characteristics.

The present invention also provides a display device including the transparent electrode.

The present invention also provides a solar cell including the transparent electrode.

According to an aspect of the present invention, there is provided a transparent electrode including: a transparent substrate; and a transparent conductive film, wherein the transparent conductive film includes a graphene sheet.

The graphene sheet is prepared by a process including: forming a graphitizing catalyst in the form of a sheet; coating an organic material on the graphitizing catalyst; and heat-treating the resultant in an inert or reductive atmosphere to form a graphene sheet.

The transparent electrode may be flexible.

According to another aspect of the present invention, there is provided a display device including the transparent electrode.

The display device may be an organic light emitting display device, an electronic paper like display, a liquid crystal display and a plasma display panel.

According to another aspect of the present invention, there is provided a solar cell including the transparent electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
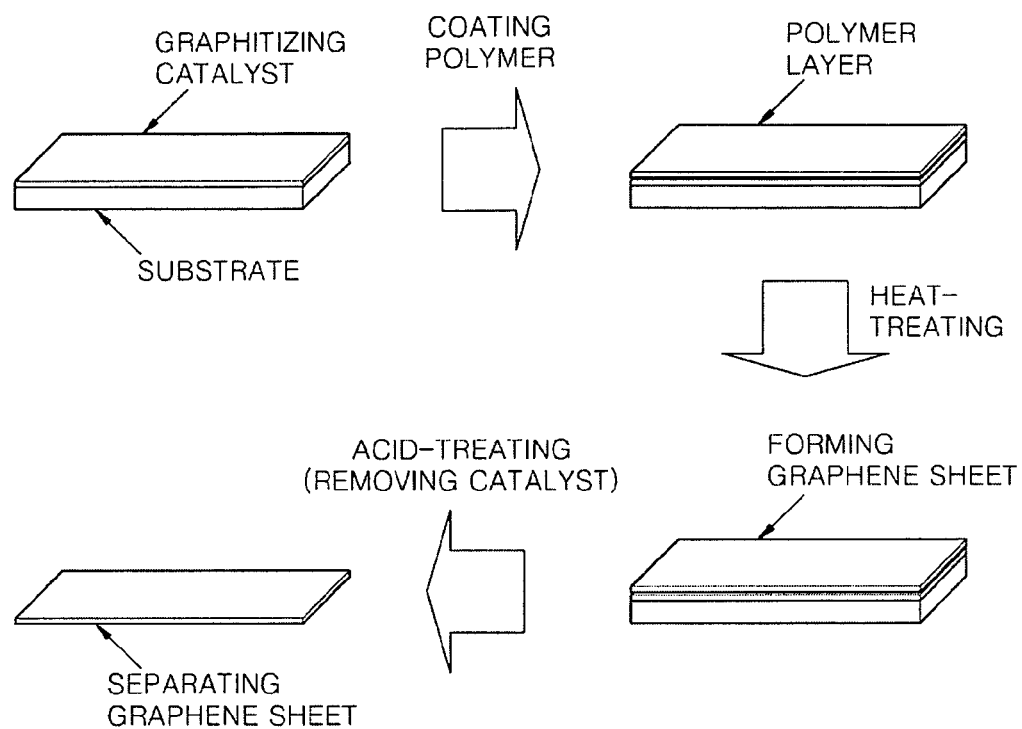
FIG. 1 schematically shows a process of preparing a graphene sheet according to the present invention.

Hereinafter, the present invention will now be described more fully with reference to the accompanying drawings, in which exemplary embodiments of the invention are shown.

The present invention provides a transparent conductive film and a transparent electrode having excellent electrical and physical characteristics by including a graphene sheet. Various display devices and solar cells including the transparent electrode can be prepared.

The transparent electrode should meet high conductivity and transmittance requirements and also flexibility requirements for ease of processing. For this, a transparent electrode is prepared using a graphene sheet as a transparent conductive film according to the present invention.

The term "graphene sheet" used herein indicates graphene in the form of a sheet formed of polycyclic aromatic molecules in which a plurality of carbon atoms are covalently bound to each other. The covalently bound carbon atoms form 6-membered rings as a repeating unit, but can form 5-membered rings and/or 7-membered rings. Accordingly, the graphene sheet looks as if the covalently bound carbon atoms (usually, $sp^2$ bond) form a single layer. The graphene sheet may have various structures according to the amount of the 5-membered rings and/or the 7-membered rings. The graphene sheet may have not only a single layer of graphene, but also a plurality of layers up to a thickness of 100 nm. Generally, the ends of the graphene are saturated with hydrogen atoms.

The most noticeable property is that electrons flow in a graphene sheet as if they are weightless, which means that electrons flow at the velocity of light in vacuum. An electron mobility of graphene sheets known so far is about from 20,000 to 50,000 $cm^2/Vs$. In addition, graphene sheets which make sheet contact with each other have a far lower contact resistance value compared to carbon nanotubes which make point contact with each other. Problems caused by surface roughness can be prevented since the graphene sheet can have a very thin thickness, and the graphene sheet is economically prepared since it can be simply separated from inexpensive graphite. In particular, it is advantageous to use graphene sheets since a device can be easily designed to obtain desired electrical characteristics in a desired direction since electrical characteristics of a graphene sheet are changed according to crystalline orientation.

According to the present invention, the transparent electrode can have excellent electrical properties, that is, high conductivity and low contact resistance, by using the graphene sheet as a transparent electrode. In addition, a flexible transparent electrode can be prepared since the graphene sheet can be very thin and flexible.

The transparent electrode including the graphene sheet according to the present invention can have excellent conductivity and improved transmittance due to the thin thickness.

The transmittance of the transparent electrode including the graphene sheet according to the present invention may be in the range of 60 to 99.9%, and a sheet resistance may be in the range of 1 to 1000 Ω/sq.

The graphene sheet can be prepared by a micromechanical method or a SiC thermal decomposition. According to the micromechanical method, a graphene sheet separated from graphite can be prepared on the surface of a Scotch™ tape by attaching the tape to a graphite sample and detaching the tape. According to the SiC thermal decomposition, SiC single crystal is heated to remove Si by decomposition of the SiC on the surface, and then residual carbon C forms a graphene sheet.

However, since the obtained graphene sheet cannot have a large area even by using the micromechanical method and a SiC thermal decomposition, these methods are used for small-sized display devices and solar cells.

In a nonlimiting example, a large-area graphene sheet can be prepared by a method comprising coating an organic material on a graphitizing catalyst, and heat-treating the resultant in an inert or reductive atmosphere as shown in FIG. 1. According to the heat-treatment, other elements of the polymer except carbon are evaporated, and the residual carbon atoms are bound to each other in a planar hexagonal structure to form a graphene sheet.

The graphitizing catalyst binds carbon atoms included in the organic material and assists the formation of the planar hexagonal structure of carbon atoms. For example, any catalyst used to synthesize graphite, induce carbonization or preparing carbon nanotubes can be used as the graphitizing catalyst. Particularly, the catalyst may be at least one selected from the group consisting of Ni, Co, Fe, Pt, Au, Al, Cr, Cu, Mg, Mn, Mo, Rh, Si, Ta, Ti, W, U, V and Zr. The graphitizing catalyst may be formed in a plate of the listed metal alone, or can be immobilized on a substrate by deposition, sputtering, or the like.

Any organic material including carbon can be coated on the graphitizing catalyst, and the structure and composition of the organic material are not limited. An organic material that forms a dense coating can be used in order to form a dense graphite layer. Typically used organic materials are irregularly arranged when coated on the graphitizing catalyst through spin coating, dip coating, or the like and form an irregular network structure. Thus the graphite layer cannot have a dense structure.

Figure 2:
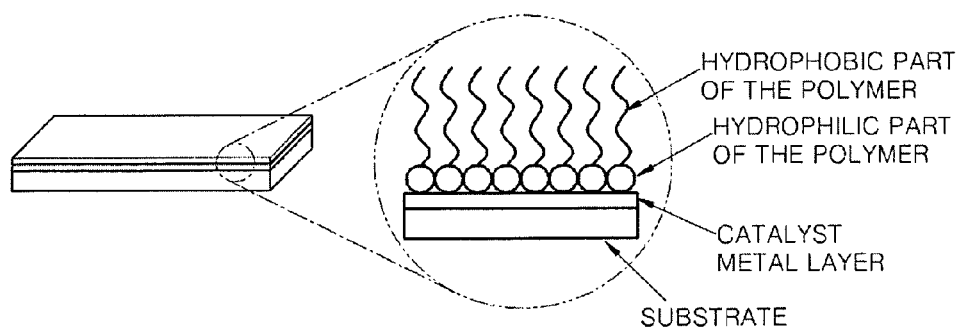
FIG. 2 schematically shows a polymer coated on a catalyst.
Figure 3:
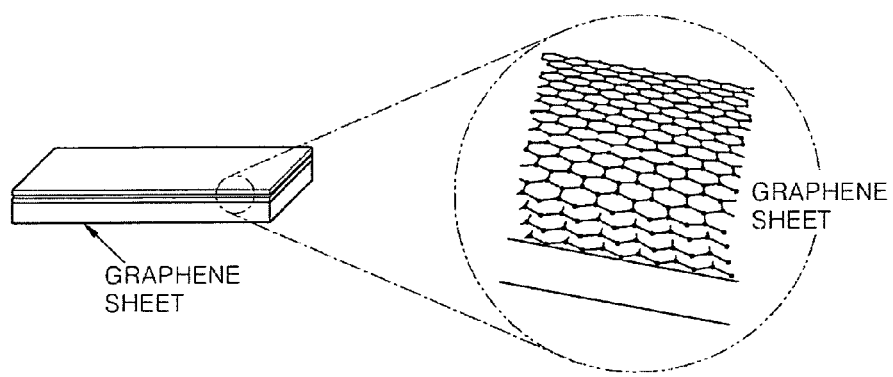
FIG. 3 schematically shows a structure of a graphene sheet formed on a catalyst.

On the other hand, when a self-assembling organic material is used to form a layer on the graphitizing catalyst, the organic material is regularly arranged in vertical directions on the surface of the graphitizing catalyst as shown in FIG. 2, and thus a graphene sheet having a dense structure can be prepared as shown in FIG. 3.

Any self-assembling organic material that is commonly used in the art can be used herein without limitation. For example, the self-assembling organic material can be a self-assembling polymer, and more particularly at least one polymer selected from the group consisting of an amphiphilic polymer, a liquid crystal polymer and a conductive polymer.

The amphiphilic polymer includes a hydrophilic group and a hydrophobic group, and thus can be arranged in a constant direction in a water soluble solution. For example, Langmuir-Blodgett arrangements, dipping arrangements, and spin arrangements are possible. The amphiphilic polymer includes a hydrophilic group having at least one of an amino group, a hydroxyl group, a carboxyl group, a sulfate group, a sulfonate group, a phosphate group and salts thereof; and a hydrophobic group having at least one of a halogen atom, a C1-C30 alkyl group, a C1-C30 halogenated alkyl group, a C2-C30 alkenyl group, a C2-C30 halogenated alkenyl group, a C2-C30 alkynyl group, a C2-C30 halogenated alkynyl group, a C1-C30 alkoxy group, a C1-C30 hylogenated alkoxy group, a C1-C30 hetero alkyl group, a C1-C30 halogenated hetero alkyl group, a C6-C30 aryl group, a C6-C30 halogenated aryl group, a C7-C30 arylalkyl group and a C7-C30 halogenated arylalkyl group. Examples of the amphiphilic polymer are capric acid, lauric acid, palmitic acid, stearic acid, myristoleic acid, palmitolic acid, oleic acid, stearidonic acid, linolenic acid, capryl amine, lauryl amine, stearyl amine and oleyl amine.

The liquid crystal polymer can be arranged in a direction in a liquid state. The conductive polymer is dissolved in a solvent to form a membrane and can form a crystalline structure by being aligned after the solvent is evaporated. Thus, the polymers can be aligned by dipping arrangements, spin coating arrangements, or the like. Examples of the polymer are polyacetylene, polypyrrole, polythiophene, polyanilline, polyfluorene, poly(3-hexylthiophene), polynaphthalene, poly(p-phenylene sulfide) and poly(p-phenylene vinylene).

Meanwhile, a polymer that is automatically aligned in a direction when deposited from vapor state, for example, a conductive polymer formed using deposition, can also be used. Examples of the conductive polymer are acene and its derivatives, anthracene and its derivatives, hetero anthracene (e.g., benzodithiophene and dithienothiophene) and its derivatives, tetracene and its derivatives (e.g., halogenated tetracene, tetracene derivatives having a polar substituent, tetracene-thiophene hybrid materials, rubrene and alkyl- and alkoxy-substituted tetracene), hetero tetracene and its derivatives, pentacene and its derivatives (e.g., alkyl- and halogen-substituted pentacene, aryl-substituted pentacene, alkynyl-substituted pentacene, alkynyl-substituted alkyl and alkynyl pentacene and alkynyl-substituted pentacene ether), hetero pentacene and its derivatives and hetero acene and its derivatives.

The organic material may include at least one polymerizable functional group capable of forming a carbon-carbon double bond or triple bond. The polymerizable functional group can induce polymerization of organic materials through a process of polymerization such as UV irradiation after the organic material layer is formed. Since thus formed organic material has a large molecular weight, evaporation of carbon can be prevented during the heat-treatment of the organic material.

The polymerization of the organic material may be performed before or after coating the organic material on the graphitizing catalyst. That is, when the polymerization is induced among the organic materials before coating the organic material on the graphitizing catalyst, a separately polymerized organic material film can be transferred to the graphitizing catalyst to form an organic material layer. The polymerization and transfer can be repeated several times to control the thickness of the graphene sheet.

The organic material can be aligned on the surface of the graphitizing catalyst using various coating methods, such as Langmuir-Blodgett, dip coating, spin coating, and vacuum deposition. The molecular weight of the aligned organic material, thickness of the organic material layer or the number of self-assembling organic material layer may vary depending on a desired number of layers of the graphene sheet. That is, use of an organic material having a large molecular weight increases the number of layers of the graphene sheet since the organic material has a large amount of carbon. As the thickness of the organic material layer increases, the number of layers of the generated graphene sheet is increased, and thus the thickness of the graphene sheet is also increased. The thickness of the graphene sheet can be controlled using the molecular weight of the organic material.

Figure 4:
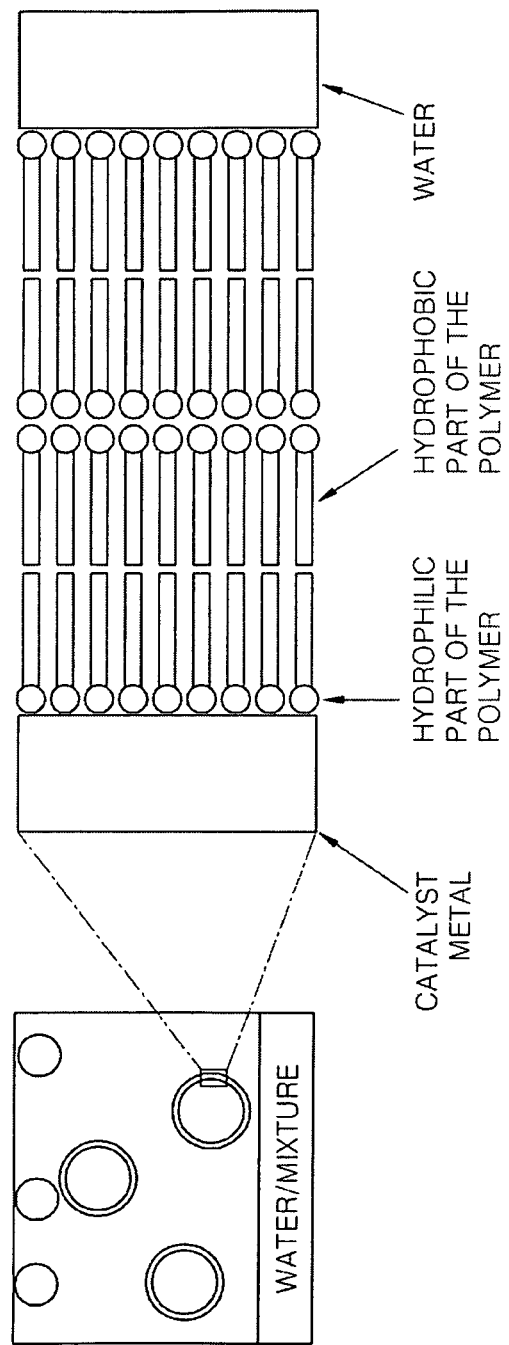
FIG. 4 schematically shows a stack of polymers having a hydrophilic part and a hydrophobic part.

In addition, the amphiphilic organic material which is a self-assembling organic material includes a hydrophilic part and a hydrophobic part in one molecule. As shown in FIG. 4, the hydrophilic part of the organic material is combined with the hydrophilic graphitizing catalyst to be uniformly aligned on the catalyst layer, and the hydrophobic part of the amphiphilic organic material is aligned in the opposite direction to be combined with the hydrophilic part of another amphiphilic organic material that is not combined with the catalyst layer. When the amount of the amphiphilic organic material is sufficient, the amphiphilic organic material can be stacked on the catalyst layer by the hydrophilic-hydrophobic bonds. The stacked layers formed of a plurality of the amphiphilic organic materials can form a graphene layer by heat-treatment. Thus, a graphene sheet having a desired thickness can be prepared since the number of layers of the graphene sheet can be controlled by selecting an appropriate amphiphilic organic material and adjusting the amount of the amphiphilic organic material.

The thickness of the graphene sheets according to the present invention may be from 0.1 nm, in the case of a single layered graphene sheet, up to 100 nm, preferably in the range of 0.1 to 20 nm, and more preferably in the range of 0.1 to 10 nm. The graphene sheet having a thickness greater than 100 nm is regarded not as graphene but as graphite, which is not within the scope of the present invention.

The area of the graphene sheet according to the present invention can be controlled by regulating the size of the substrate on which the graphitizing catalyst is formed, and thus a large-area graphene sheet can be prepared without difficulty. That is, a large-area graphene sheet can be prepared by preparing a substrate having a large area, for example, a substrate having an area greater than 1 mm×1 mm, and preferably greater than 10 mm×10 mm, forming a graphitizing catalyst on the substrate using various methods, coating the organic material on the graphitizing catalyst, and heat-treating the resultant. Accordingly, the area of the graphene sheet can be adjusted by merely controlling the size of the substrate. The substrate may be a silicon substrate, but the present invention is not limited thereto.

The organic material coated on the graphitizing catalyst is heat-treated to be subjected to graphitization. The heat-treatment can be performed in an inert or reductive atmosphere in order to prevent oxidation of the elements of the organic material. The heat-treatment is performed at a temperature in the range of 400 to 2,000° C. When the temperature is lower than 400° C., the graphitization cannot be sufficiently performed. On the other hand, when the temperature is higher than 2,000° C., carbon may be evaporated. The heat-treatment may be performed for 0.1 to 10 hours. When the heat-treatment time is not within the range described above, the graphitization cannot be sufficiently performed or economical efficiency may be decreased.

The heat-treatment may be performed by induction heatings, radiant heats, lasers, infrared rays (IR), microwaves, plasma, ultraviolet (UV) rays or surface plasmon heatings without limitation. Particularly, the graphitizing catalyst on which the organic material is coated can only selectively be activated by selectively heating the catalyst by the induction heatings or the microwaves. Thus, a specific region can be graphitized, and a single-layered graphene sheet can be prepared by graphitizing a polymer having a short length.

The carbon atoms of the organic material can be covalently bound to each other by the heat-treatment and form a planar hexagonal structure to form a graphene sheet. The graphene sheet can be used with the graphitizing catalyst. If required, the graphene sheet may be separated from the graphitizing catalyst by dissolving and removing the graphitizing catalyst by an acid-treatment.

The separated graphene sheet can be processed in a variety of ways according to its use as desired. That is, the graphene sheet can be cut into a predetermined shape, or can be wound to form a tube. In addition to the above method, the graphene sheet may be prepared by diverse methods. The processed graphene sheet can be combined with a desired subject for applications. Particularly, the transparent electrode can be simply prepared by transferring the graphene sheet to a substrate or a subject.

The transparent electrode which employs the graphene sheet prepared by the process described above can be simply prepared, and thus has high economical efficiency, high conductivity and excellent membrane uniformity. Particularly, a large-area transparent electrode can be prepared and transmittance thereof can be adjusted by controlling a thickness of the graphene sheet. In addition, the transparent electrode can be used for a variety of applications which require flexibility and ease of handling.

The transparent electrode including the graphene sheet can be efficiently applied to various display devices, such as a liquid crystal display, an electronic paper like display, an organic light emitting display device, and batteries, such as a solar cell.

As described above, since the transparent electrode according to the present invention is flexible, the display device can be bent and conveniently used by employing the transparent electrode. In addition, the solar cell can have various bent structure toward light to improve light efficiency by employing the transparent electrode according to the present invention.

When the transparent electrode including the graphene sheet according to the present invention is applied to various devices, the thickness of the transparent electrode can be adjusted according to a desired transmittance. For example, the thickness of the transparent electrode may be in the range of 0.1 to 100 nm. When the thickness of the transparent electrode is greater than 100 nm, transmittance may be decreased to reduce light efficiency. When the thickness of the transparent electrode is less than 0.1 nm, sheet resistance may be too low or membranes of the graphene sheet may become ununiform.

Figure 5:
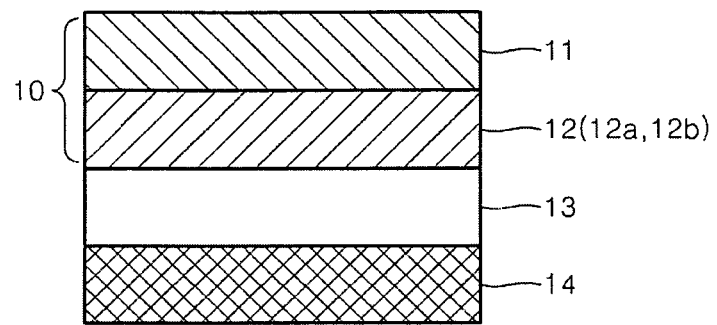
FIG. 5 schematically shows a structure of a dye-sensitized solar cell.

An example of a solar cell employing the transparent electrode including the graphene sheet according to the present invention is a dye-sensitized solar cell as shown in FIG. 5. The dye-sensitized solar cell includes a semiconductor electrode 10, an electrolyte layer 13 and an opposite electrode 14. The semiconductor electrode 10 includes a conductive transparent substrate 11 and a light absorbance layer 12. The conductive glass substrate is coated with a colloid solution of a nanoparticle oxide 12a and heated in an electric furnace at a high temperature, and then a dye 12b is adsorbed thereto, thereby producing a dye-sensitized solar cell.

A transparent electrode including a graphene sheet according to the present invention can be used as the conductive transparent substrate 11. The transparent electrode can be prepared by transferring the graphene sheet onto a transparent substrate, and examples of the transparent substrate are a transparent polymer such as polyethylene terephthalate, polycarbonate, polyimide or polyethylene naphthalate and a glass substrate. This can be applied to the opposite electrode 14.

In order to prepare the dye-sensitized solar cell into a bent structure, for example, into a cylindrical structure, the opposite electrode 14 in addition to the transparent electrode should be formed of a soft material.

The nanoparticle oxide 12a is a nanoparticle semiconductor, and preferably an n-type semiconductor providing current to an anode via electrons generated by photo excitation as a carrier. Examples of the nanoparticle oxide 12a are $TiO_2$, $SnO_2$, $ZnO_2$, $WO_3$, $Nb_2O_5$, $Al_2O_3$, $MgO$ and $TiSrO_3$, and preferably anatase $TiO_2$, but are not limited thereto. The metal oxides can be used alone or in combination of at least two metal oxides. The semiconductor nanoparticles may have a large surface to increase light absorption by the dye 12b adsorbed to the surface of the semiconductor nanoparticles. For this, the diameter of the semiconductor nanoparticles may be less than 20 nm.

Any dye that can be commonly used in fields of solar cells or photocells can be used for the dye 12b, and a ruthenium complex is preferable. The ruthenium complex may be $RuL_2(SCN)_2$, $RuL_2(H_2O)_2$, $RuL_3$, $RuL_2$ and the like, wherein L is 2,2'-bipyridyl-4,4'-dicarboxylate, or the like. However, any dye that can separate charges and can be sensitized can be used for the dye 12b. Examples of the dye 12b are a xanthene dye such as rhodamine B, rose bengal, eosin and erythrocin; a cyanine dye such as quinocyanin and cryptocyanin; a basic dye such as phenosafranine, a capri blue, thiosin and methylene blue; a porphyrin-based compound such as chlorophyll, Zn porphyrin and Mg porphyrin; an azo compound; a phthalocyanine compound; a complex compound such as Ru tris-bipyricyl complex; an anthraquinone dye and a polycyclic quinine dye in addition to the ruthenium complex. The dyes can be used alone or in combination of at least two dyes.

The thickness of the light absorbance layer 12 including the nanoparticle oxide 12a and the dye 12b may be less than 15 microns, and preferably in the range of 1 to 15 microns since the light absorbance layer 12 has a large series resistance which decreases conversion efficiency. By controlling the thickness to less than 15 microns, the light absorbance layer 12 can have low series resistance and prevent reduction in conversion efficiency while maintaining its intrinsic functions.

The electrolyte layer 13 used in the dye-sensitized solar cell may be a liquid electrolyte, an ionic liquid electrolyte, an ionic gel electrolyte, a polymer electrolyte and a complex thereof. The electrolyte layer 13 mainly formed of an electrolyte solution may include the light absorbance layer 12, or may be formed such that the electrolyte solution is infiltrated into the light absorbance layer 12. The electrolyte solution may be iodide-acetonitrile, but the present invention is not limited thereto. Any electrolyte solution that can transfer holes can be used without limitation.

In addition, the dye-sensitized solar cell may further include a catalyst layer. The catalyst layer may be added to facilitate oxidation and reduction of the dye-sensitized solar cell, and examples are platinum, carbon, graphite, carbon nanotube, carbon black, p-type semiconductor and a complex thereof. The catalyst layer is interposed between the electrolyte layer and the opposite electrode. The surface area of the catalyst may be increased by microstructures. For example, platinum black may be used for platinum and porous structure may be used for carbon. The platinum black can be prepared by anodizing platinum or treating platinum using chloroplatinic acid. The porous carbon can be prepared by calcining carbon microparticles or sintering organic polymers.

The dye-sensitized solar cell has excellent light efficiency and processability by employing the transparent electrode including the graphene sheet having excellent conductivity and flexibility.

The display device including the transparent electrode including the graphene sheet according to the present invention may be an electronic paper like display, an organic light emitting display device, a liquid crystal display, or the like. Among display devices described above, an organic light emitting display device is an active type light emitting display device in which when a current is applied to a fluorescent or phosphoric organic compound thin layer, electrons are combined with holes in the organic layer, thereby emitting light. A conventional organic light emitting display device includes an anode, a hole transport layer, an emission layer, an electron transport layer, and a cathode, which are sequentially formed on a substrate. In order to easily inject holes, the organic light emitting display device may further include an electron injection layer and a hole injection layer. If required a hole blocking layer and a buffer layer can further be included. Since a transparent material having high conductivity is preferable for the anode, the transparent electrode including the graphene sheet according to the present invention can be used as the anode.

The hole transport layer can be formed of any material that is commonly used in the art without limitation, and preferably polytriphenylamine.

The electron transport layer can be formed of any material that is commonly used in the art without limitation, and preferably polyoxadiazole.

Light emitting materials used for the emission layer may be fluorescent or phosphorescent material commonly used in the art, and may further include at least selected from the group consisting of one high molecular weight host, a mixture of a high molecular weight and low molecular weight hosts, a low molecular weight host and a non-light emitting polymer matrix. Here, any material that is commonly used to form an emission layer of an organic light emitting display device may be used for the high molecular weight host, the low molecular weight host and the non-light emitting polymer matrix. Examples of the high molecular weight host are poly (vinylcarbazole), polyfluorene, poly(p-phenylene vinylene) and polythiophene, examples of the low molecular weight host are 4,4'-N,N'-dicarbazole-biphenyl (CBP), 4,4'-bis[9-(3, 6-biphenylcarbozolyl)]-1-1,1'-biphenyl, 9,10-bis[(2',7'-t-butyl)-9',9'''-spirobifluorenyl anthracene and tetrafluorene, and examples of the non-radiative polymer matrix are polymethyl methacrylate and polystyrene, but are not limited thereto. The emission layer can be formed using vacuum deposition, sputtering, printing, coating, inkjet printing, or the like.

The organic light emitting display device can be prepared according to conventional methods using a conventional light emitting material without using any particular device.

According to the present invention, a transparent electrode having improved electrical characteristics can be prepared by employing a large-area graphene sheet which can be economically prepared. The transparent electrode can be efficiently applied to various display devices or solar cells.

The present invention will be described in further detail with reference to the following examples. These examples are for illustrative purposes only and are not intended to limit the scope of the present invention.

Preparation Example 1

Ni was deposited on a 3 cm×3 cm silicon substrate on which 100 nm of $SiO_2$ was coated using sputtering to form a Ni thin film. An oleic acid solution having a concentration of 1 mg/ml was prepared by dissolving oleic acid in chloroform. 50 μl of the oleic acid solution was added a Langmuir-Blodgett (LB) device to which water was added. After the oleic acid solution was added, a self assembled monolayer (SAM) was prepared using the LB device. 254 nm UV was irradiated thereto to polymerize the SAM layer formed of oleic acid. The obtained oleic acid SAM was transferred to a 3 cm×3 cm silicon substrate on which 100 nm of $SiO_2$ was coated.

Then, the oleic acid coated substrate was heated in vacuum at 60° C. for 12 hours and dried. The dried oleic acid coated substrate was heat-treated in a furnace under a nitrogen atmosphere 500° C. for 1 hour to prepare a substrate having a graphene sheet with a thickness of about 0.4 nm and an area of 3 cm×3 cm. Then, the substrate including the graphene sheet was immersed in 0.1 M HCl for 24 hours to remove the Ni thin film and the graphene sheet was separated.

Preparation Example 2

A 3 cm×3 cm graphene sheet having a thickness of about 3.5 nm was prepared in the same manner as in Preparation Example 1, except that transferring the oleic acid SAM polymerized according to Preparation Example 1 to the silicon substrate was repeated 10 times.

Preparation Example 3

A 3 cm×3 cm graphene sheet having a thickness of about 7 nm was prepared in the same manner as in Preparation Example 1, except that transferring the oleic acid SAM polymerized according to Preparation Example 1 to the silicon substrate was repeated 20 times.

Preparation Example 4

A 3 cm×3 cm graphene sheet having a thickness of about 15 nm was prepared in the same manner as in Preparation Example 1, except that transferring the oleic acid SAM polymerized according to Preparation Example 1 to the silicon substrate was repeated 40 times.

Preparation Example 5

Ni was deposited on a silicon substrate having a diameter of 4 inches on which 100 nm of $SiO_2$ was coated using sputtering to form a Ni thin film. The substrate on which Ni was immobilized was immersed in a mixed solution of 0.1 L of water and 100 μg of oleic acid and stirred at 200 rpm. After 4 hours, the substrate was heated in vacuum at 60° C. for 12 hours to remove water. The dried oleic acid coated substrate was heat-treated under a nitrogen atmosphere in a furnace at 500° C. for 1 to obtain a graphene sheet having a thickness of about 1.5 nm.

Then, the substrate including the graphene sheet was immersed in 0.1 M HCl for 24 hours to remove the Ni thin film and the graphene sheet was separated.

Example 1

Preparation of Transparent Electrode

A transparent electrode was prepared by transferring a graphene sheet prepared according to Preparation Example 1 onto a 3 cm×3 cm transparent polyethylene terephthalate substrate. The prepared transparent electrode had 92% of transmittance and 43 Ω/sq. of conductivity.

Example 2

Preparation of Solar Cell

A paste including titanium oxide particles having an average particle size of from 7 to 25 nm was coated on the transparent electrode having an area of 1 $cm^2$ prepared according to Example 1, and sintered at a low temperature less than 150° C. to prepare a porous titanium oxide film having a thickness of about 15 μm. Then, dyes were adsorbed to the porous titanium oxide film in 0.3 mM Ru(4,4'-dicarboxy-2,2'-bipyridyl)$_2$(NCS)$_2$ solution dissolved in ethanol at room temperature. The porous titanium oxide film to which the dyes are adsorbed was washed with ethanol and dried at room temperature to prepare a photocathode.

Pt reduction electrode was deposited on the transparent electrode prepared according to Example 1 using sputtering and a microhole having a diameter of 0.75 mm was perforated using a drill to inject an electrolyte solution to prepare an opposite electrode.

The photocathode and a counter electrode were assembled by placing a thermoplastic polymer film having a thickness of 60 μm between the photocathode and the counter electrode and pressing them. An oxidation-reduction electrolyte was injected through the microhole formed in the opposite electrode, and the microhole was blocked using a cover glass and a thermoplastic polymer film to prepare a dye-sensitized solar cell. The oxidation-reduction electrolyte used herein was prepared by dissolving 21.928 g of tetrapropylammonium iodide and 1.931 g of $I_2$ in a solvent including 80% of ethylene carbonate and 20% of acetonitrile.

Example 3

Preparation of Organic Light Emitting Display Device

An electrode pattern was formed on the transparent electrode prepared according to Example 1 and washed. PEDOT was coated on the washed transparent electrode to a thickness of 50 nm and baked at 120° C. for 5 minutes to prepare a hole injection layer.

A green 223 polymer was coated on the hole injection layer by spin coating and baked at 100° C. for 1 hour, and then the solvent was completely removed in an oven in vacuum to form an emission layer having a thickness of 80 nm.

Then, $Alq_3$ was vacuum deposited on the polymer emission layer at 1.0 Å/sec using a vacuum depositor under a pressure of $4×10^{-6}$ torr or less to form an electron transport layer with a thickness of 30 nm. Then, LiF was vacuum deposited thereon at 0.1 Å/sec to form an electron injection layer with a thickness of 5 nm.

Then, Al was deposited on the electron injection layer at 10 Å/sec to form a cathode with a thickness of 200 nm. The resultant was encapsulated to prepare an organic light emitting display device. The encapsulation was performed by adding BaO powder into a glove box under a dry nitrogen gas atmosphere, sealing the glove box using a metal can, and treating the resultant with a UV hardening agent.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A transparent electrode comprising:
a transparent substrate comprising a glass;
and a transparent conductive film comprising a graphene sheet,
wherein the transparent conductive film is disposed directly on the transparent substrate,
wherein the graphene sheet is synthesized by growth-process, and wherein the growth-process comprises:
forming a graphitizing catalyst in the form of a sheet;
providing an organic material on a surface of the graphitizing catalyst; and
heat-treating the organic material on the graphitizing catalyst in an inert or reductive atmosphere; and
wherein the graphene sheet has an area equal to or greater than 1 mm×1 mm.

2. The transparent electrode of claim 1, wherein the transparent electrode is flexible.

3. The transparent electrode of claim 1, wherein the thickness of the graphene sheet is in the range of 0.1 to 100 nm.

4. The transparent electrode of claim 1, wherein the sheet resistance of the transparent electrode is in the range of 1 to 900 Ω/sq., and transmittance of the transparent electrode is in the range of 70 to 99.9%.

5. A display device comprising a transparent electrode according to claim 1.

6. The display device of claim 5, wherein the display device is one of a liquid crystal display, an electronic paper like display, and an organic light emitting display device.

7. An organic light emitting display device comprising:
an anode; a hole transport layer; an emission layer; an electron transport layer and a cathode, wherein the anode is a transparent electrode according to claim 1.

8. The organic light emitting display device of claim 7, further comprising an electron injection layer and a hole injection layer.

9. A solar cell comprising a transparent electrode according to claim 1.

10. A dye-sensitized solar cell comprising a semiconductor electrode, an electrolyte layer, and an opposite electrode,
wherein the semiconductor electrode comprises a transparent electrode and a light absorbance layer which includes a nanoparticle oxide and a dye, and
the transparent electrode and the opposite electrode are a transparent electrode according to claim 1.

11. A display device comprising a transparent electrode according to claim 2.

12. A display device comprising a transparent electrode according to claim 3.

13. A display device comprising a transparent electrode according to claim 4.

14. An organic light emitting display device comprising:
an anode;
a hole transport layer;
an emission layer;
an electron transport layer;
and a cathode,
wherein the anode is a transparent electrode according to claim 2.

15. An organic light emitting display device comprising:
an anode;
a hole transport layer;
an emission layer;
an electron transport layer; and
a cathode,
wherein the anode is a transparent electrode according to claim 3.

16. An organic light emitting display device comprising:
an anode;
a hole transport layer;
an emission layer;
an electron transport layer; and
a cathode,
wherein the anode is a transparent electrode according to claim 4.

17. The transparent electrode of claim 1, wherein the graphene sheet is a single layer or double layers of graphene.

18. The transparent electrode of claim 17, wherein each graphene layer of the graphene sheet has a patterned shape.

19. The transparent electrode of claim 17, wherein a length of a side of each graphene layer of the graphene sheet is greater than or equal to 1 mm.

* * * * *